United States Patent
Kim et al.

(10) Patent No.: US 8,664,707 B2
(45) Date of Patent: Mar. 4, 2014

(54) SEMICONDUCTOR DEVICE

(75) Inventors: Ji-Young Kim, Los Angeles, CA (US);
Kang L. Wang, Santa Monica, CA (US);
Yong-Jik Park, Gyeonggi-do (KR);
Jeong-Hee Han, Gyeonggi-do (KR);
Augustin Jinwoo Hong, Los Angeles, CA (US)

(73) Assignees: Samsung Electronics Co., Ltd. (KR);
The Regents of the University of California, Oakland, CA (US)

( * ) Notice: Subject to any disclaimer, the term of this patent is extended or adjusted under 35 U.S.C. 154(b) by 77 days.

(21) Appl. No.: 13/428,706

(22) Filed: Mar. 23, 2012

(65) Prior Publication Data

US 2012/0181593 A1  Jul. 19, 2012

Related U.S. Application Data

(63) Continuation of application No. 12/481,403, filed on Jun. 9, 2009, now Pat. No. 8,164,134.

(51) Int. Cl.
*H01L 29/792* (2006.01)

(52) U.S. Cl.
USPC ........... 257/314; 257/328; 257/329; 257/330; 257/397; 257/E29.309

(58) Field of Classification Search
USPC .................. 257/314, 328, 329, 330, 390, 397
See application file for complete search history.

(56) References Cited

U.S. PATENT DOCUMENTS

| | | | |
|---|---|---|---|
| 6,913,969 B2 | 7/2005 | Yoo | |
| 7,135,726 B2 | 11/2006 | Endoh et al. | |
| 7,679,133 B2 | 3/2010 | Son et al. | |
| 7,847,334 B2 | 12/2010 | Katsumata et al. | |
| 7,892,945 B2 | 2/2011 | Bedell et al. | |
| 7,897,463 B2 * | 3/2011 | Yun et al. | 438/270 |
| 8,164,134 B2 * | 4/2012 | Kim et al. | 257/314 |
| 2002/0195668 A1 * | 12/2002 | Endoh et al. | 257/390 |
| 2005/0236680 A1 | 10/2005 | Yoo | |
| 2006/0202263 A1 | 9/2006 | Lee | |
| 2007/0212880 A1 | 9/2007 | Park et al. | |
| 2008/0253183 A1 * | 10/2008 | Mizukami et al. | 365/185.05 |
| 2010/0006922 A1 * | 1/2010 | Matsuoka et al. | 257/324 |
| 2010/0044778 A1 | 2/2010 | Seol et al. | |
| 2010/0059807 A1 | 3/2010 | Cho et al. | |

FOREIGN PATENT DOCUMENTS

| | | |
|---|---|---|
| JP | 2003-124362 | 4/2003 |
| JP | 2004-048004 | 2/2004 |
| JP | 2005-268438 | 9/2005 |
| JP | 2007-180389 | 7/2007 |

(Continued)

*Primary Examiner* — Matthew W Such
*Assistant Examiner* — David Spalla
(74) *Attorney, Agent, or Firm* — Myers Bigel Sibley & Sajovec, P.A.

(57) ABSTRACT

Provided is a semiconductor device that can include a lower interconnection on a substrate and at least one upper interconnection disposed on the lower interconnection. At least one gate structure can be disposed between the upper interconnection and the lower interconnection, where the gate structure can include a plurality of gate lines that are vertically stacked so that each of the gate lines has a wiring portion that is substantially parallel to an upper surface of the substrate and a contact portion that extends from the wiring portion along a direction penetrating an upper surface of the substrate. At least one semiconductor pattern can connect the upper and lower interconnections.

17 Claims, 16 Drawing Sheets

(56) References Cited

FOREIGN PATENT DOCUMENTS

| KR | 1020030094683 A | 12/2003 |
| KR | 1020040005331 A | 1/2004 |
| KR | 1020050014351 A | 2/2005 |
| KR | 1020050097595 A | 10/2005 |
| KR | 1020050108775 A | 11/2005 |
| KR | 1020060099690 A | 9/2006 |
| KR | 100706815 B1 | 4/2007 |
| KR | 1020070046348 A | 5/2007 |

* cited by examiner

SEMICONDUCTOR DEVICE

REFERENCE TO RELATED APPLICATION

This application is a continuation of U.S. application Ser. No. 12/481,403, filed Jun. 9, 2009 now U.S. Pat. No. 8,164,134 in the United States Patent and Trademark Office the disclosure of which is hereby incorporated herein by reference in its entirety.

BACKGROUND

The present invention relates to a semiconductor device and a method of fabricating the same.

The integration degree of a typical 2-dimensional or planar memory semiconductor device can be determined by an occupation area of a unit memory cell, and thus the integration degree may be affected by a technology of forming a fine pattern. However, it may be expensive to form a fine pattern, and therefore the integration degree of a 2-dimensional memory semiconductor device may somewhat increase but there may be limits to the increases in the level of integration.

SUMMARY

Embodiments of the present invention may provide a semiconductor device that includes a lower interconnection on a substrate and at least one upper interconnection disposed on the lower interconnection. At least one gate structure can be disposed between the upper interconnection and the lower interconnection, where the gate structure can include a plurality of gate lines that are vertically stacked so that each of the gate lines has a wiring portion that is substantially parallel to an upper surface of the substrate and a contact portion that extends from the wiring portion along a direction penetrating an upper surface of the substrate. At least one semiconductor pattern can connect the upper and lower interconnections.

In some embodiments according to the inventive concept, the contact portions of the gate lines have top surfaces that are disposed at substantially the same level from the top surface of the substrate. In some embodiments according to the inventive concept, a length of the wiring portion is reduced, as the wiring portion is more distant from the substrate. In some embodiments according to the inventive concept, the substrate includes a cell array region and a contact region, and a vertical distance between a top surface of the gate structure and the upper surface of the substrate in the cell array region is smaller than a vertical distance between a top surface of the gate structure and the upper surface of the substrate in the contact region.

In some embodiments according to the inventive concept, the device can include interconnection lines that are connected to the contact portions of the gate lines, respectively. In some embodiments according to the inventive concept, the device can include an upper selection line that is connected to the uppermost gate line and a lower selection line that is connected to the lowermost gate line.

In some embodiments according to the inventive concept, the device includes a data storage layer that is disposed between the semiconductor pattern and the gate lines. In some embodiments according to the inventive concept, the semiconductor pattern alternately covers two opposite sidewalls of the gate lines. In some embodiments according to the inventive concept, the semiconductor pattern covers an upper surface and a lower surface of each of the gate lines.

In some embodiments according to the inventive concept, the device includes a mold insulation layer on the substrate, and a sidewall of the mold insulation layer has a plurality of undercut regions that are vertically spaced apart from each other, where the semiconductor pattern conformally covers the sidewall of the mold insulation layer. In some embodiments according to the inventive concept, the mold insulation layer includes first and second mold patterns that are alternately stacked, and the second mold pattern is wider than the first mold pattern, and is disposed between the first mold patterns.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS ACCORDING TO THE INVENTIVE CONCEPT

Objects, other objects, features and advantages of the present invention can be easily understood through following preferred embodiments with reference to the accompanying drawings. However, the present invention is not limited to embodiments described herein, but can be implemented in another configuration. Rather, these embodiments are provided so that this disclosure will be thorough and complete, and will fully convey the scope of the present invention to those skilled in the art.

It will be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Like numbers refer to like elements throughout. As used herein the term "and/or" includes any and all combinations of one or more of the associated listed items and may be abbreviated as "/".

Figure 1:
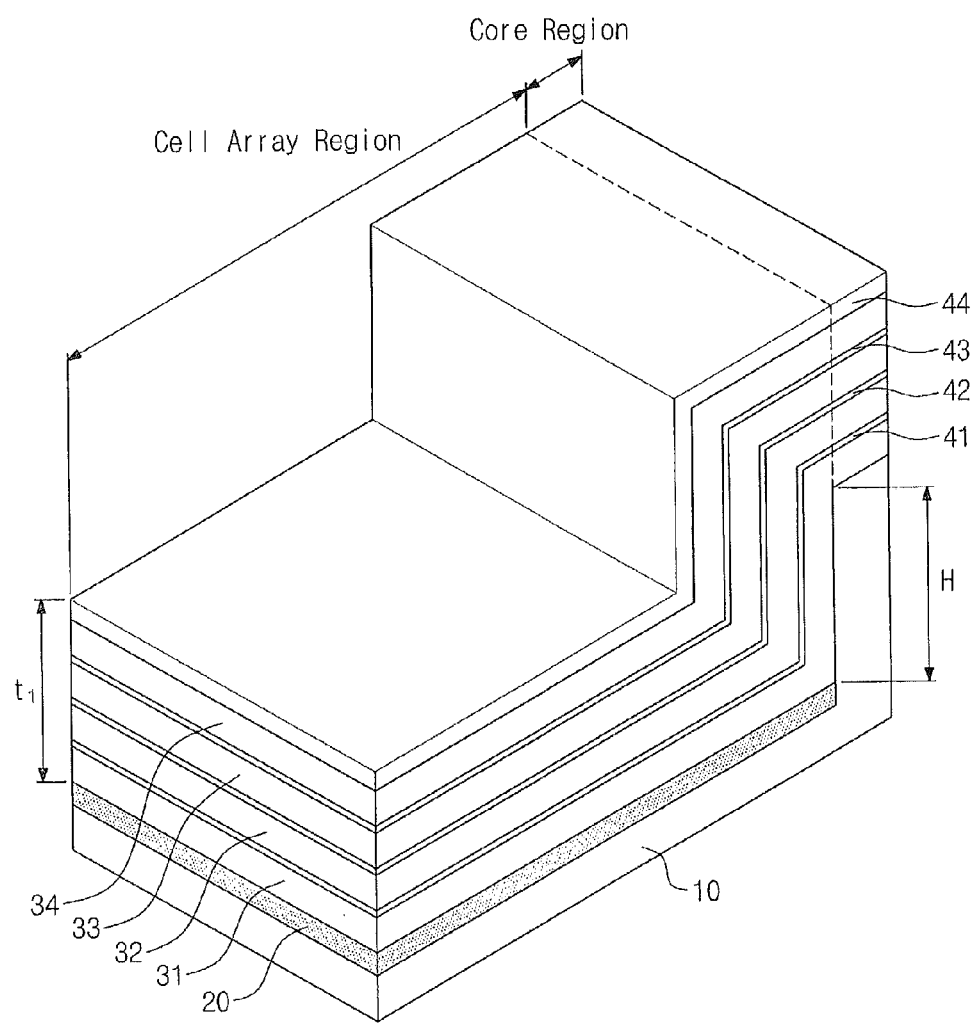
FIGS. 1 through 8 are perspective views illustrating a method of fabricating a semiconductor device according to an embodiment of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the FIG. 1 is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 through 8 are perspective views illustrating a method of fabricating a semiconductor device according to an embodiment of the present invention.

Referring to FIG. 1, a substrate 10 is prepared, which includes a cell array region and a core region. As illustrated in FIG. 1, a top surface of the cell array region may be lower than a top surface of the core region. According to an embodiment, this structure can be formed through a patterning process of recessing the substrate 10 in the cell array region. According to another embodiment, this structure can be formed by forming a predetermined thin film (not shown) on the substrate 10, and then etching the thin film in the cell array region. Herein, the predetermined thin film has a thickness corresponding to a step height H between the two regions.

Thereafter, as illustrated in FIG. 1, first mold layers 31, 32, 33 and 34 and second mold layers 41, 42, 43 and 44 are sequentially and alternatingly deposited onto the substrate 10. The first mold layers 31, 32, 33 and 34 and the second mold layers 41, 42, 43 and 44 are conformally formed on the substrate 10, and a total thickness t1 of the first mold layers 31, 32, 33 and 34 and the second mold layers 41, 42, 43 and 44 may be smaller than the step height H between the cell array region and the core region.

According to the embodiments of the present invention, the first mold layers 31 to 34 may be formed of materials having an etch selectivity with respect to the second mold layers 41 to 44. That is, the first mold layers 31 to 34 may be formed of materials that can be selectively removed while minimizing etched amounts of the second mold layers 41 to 44. For example, the first mold layers 31 to 34 may include a silicon oxide layer, and the second mold layers 41 to 44 may include a silicon nitride layer. However, materials used for the first and second mold layers 31 to 34 and 41 to 44 are not limited to the above-described examples, and may be one of combinations of materials satisfying the etch selectivity condition.

According to an embodiment, the first mold layers 31 to 34 may be thicker than the second mold layers 41 to 44. Meanwhile, the uppermost second mold layer 44 may be thicker than the other second mold layers 41 to 43 as illustrated in FIG. 1 because it can be used as an etch mask during a subsequent patterning process.

Before the first and second mold layers 31 to 34 and 41 to 44 are formed, a lower impurity region 20 may be formed in the cell array region of the substrate 10. The lower impurity region 20 may have a conductivity type differing from that of the substrate 10.

Figure 2:
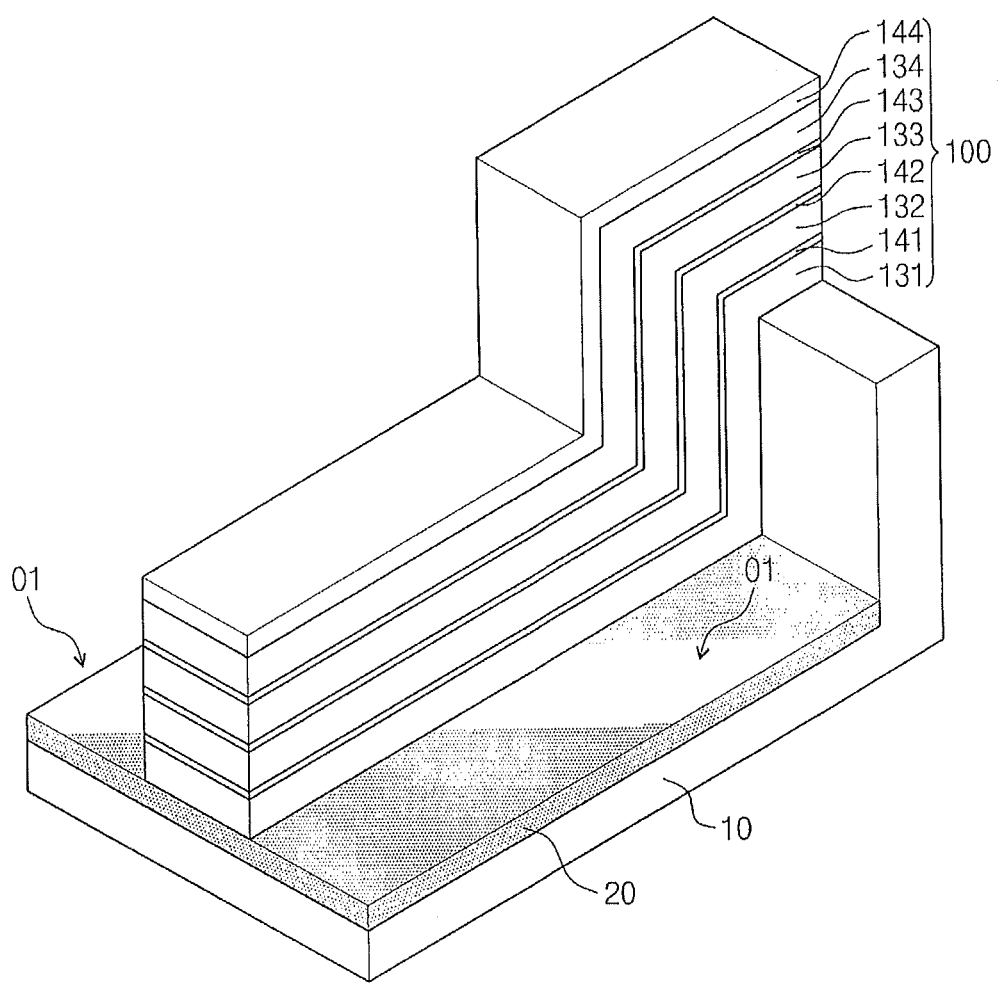

Referring to FIG. 2, the first mold layers 31 to 34 and the second mold layers 41 to 44 are patterned to form at least one mold structure 100 defining first openings O1 that expose the top surface of the substrate 10. Each of the mold structures 100 may include first mold patterns 131, 132, 133 and 134 and second mold patterns 141, 142, 143 and 144, which are formed by patterning the first mold layers 31 to 34 and the second mold layers 41 to 44. As illustrated in FIG. 2, the second mold patterns 141 to 144 and the first mold patterns 131 to 134 have exposed side surfaces defining the first openings O1.

The mold structures 100 may be formed in such a manner that the uppermost second mold layer 44 is patterned to form a second mold pattern 144, and thereafter a patterning process is performed using the second mold pattern 144 as a hard mask. According to modified embodiments, before forming the mold structures 100, a planarization process may be further performed to reduce a difficulty in patterning due to a step between the cell array region and the core region. The planarization process may include a process of forming an additional layer, and an etchback process.

Figure 3:
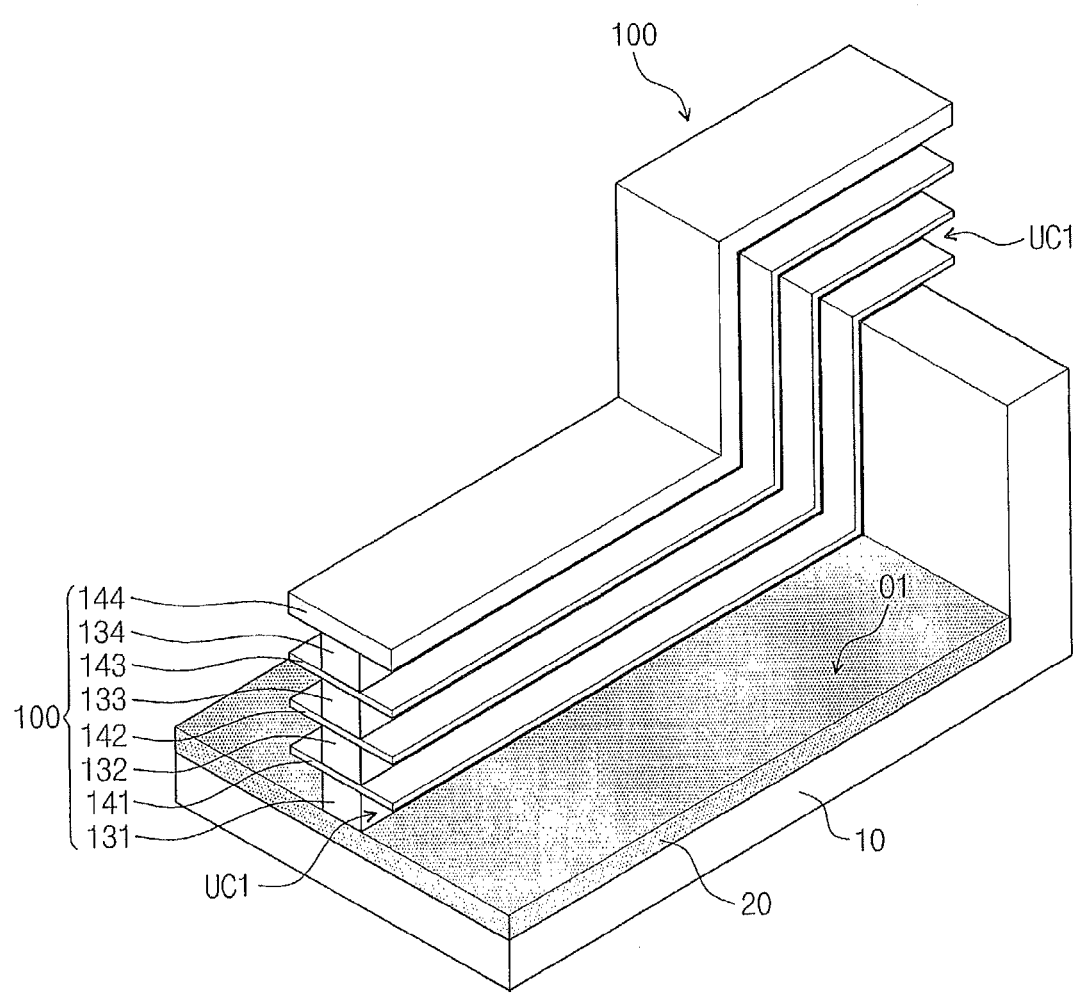

Referring to FIG. 3, the exposed side surfaces of the first mold patterns 131 to 134 are selectively etched in such a way to have widths smaller than the second mold patterns 141 to 144. Accordingly, first undercut regions UC1 are formed between the second mold patterns 141 to 144.

The forming of the first undercut regions UC1 may include etching the first mold patterns 131 to 134 using an etch recipe having an etch selectivity with respect to the second mold patterns 141 to 144. This etching process may be performed using an isotropic etch. Also, the etching process may be performed using an etch recipe having an etch selectivity with respect to the substrate 10 and the second mold patterns 141 to 144.

Figure 4:
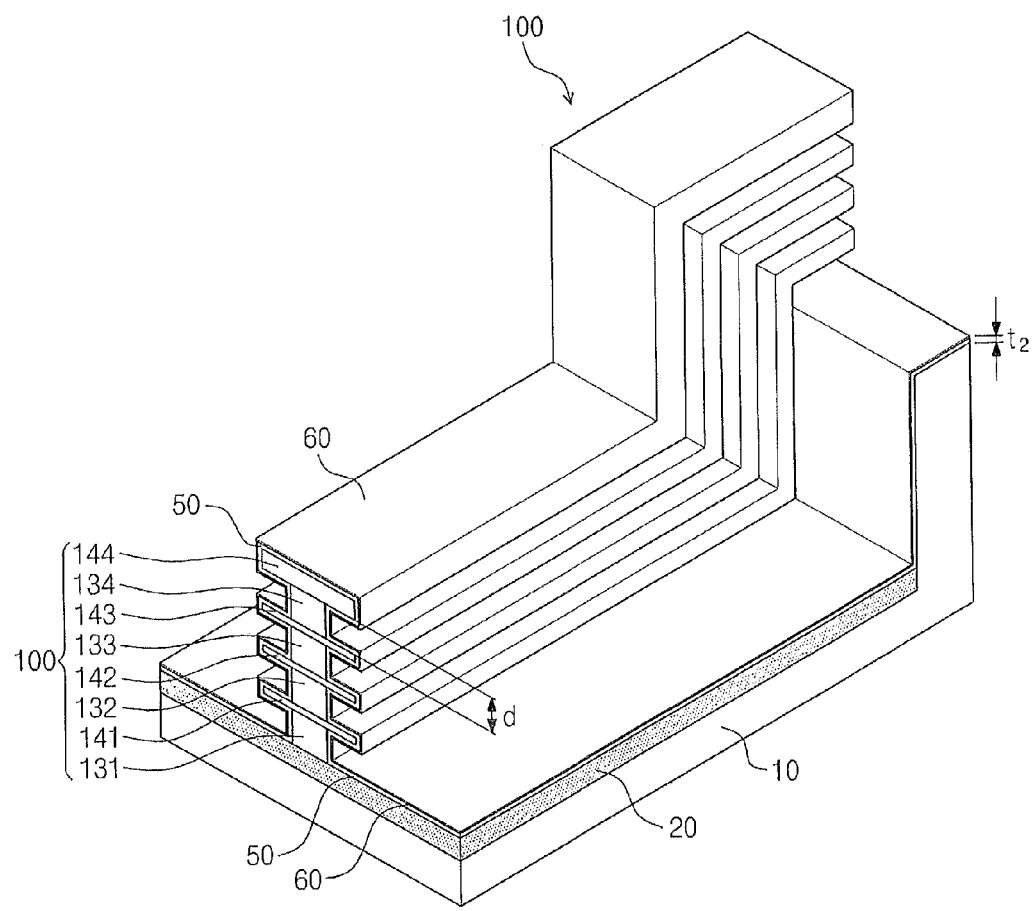
Figure 9:
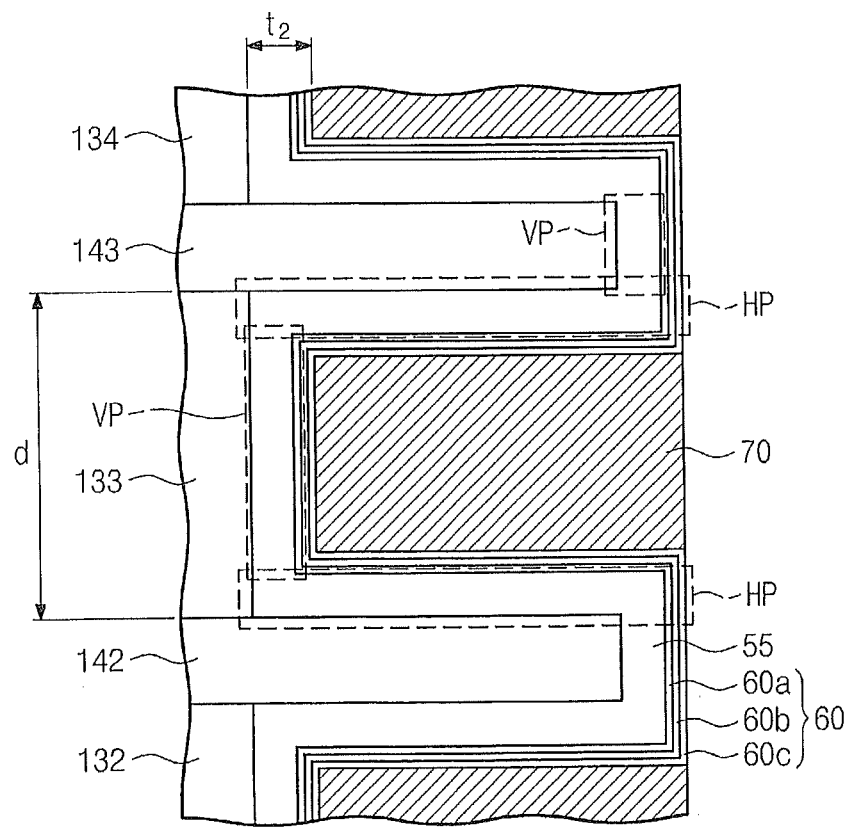
FIG. 9 is a cross-sectional view illustrating a portion of the semiconductor device according to the embodiment of the present invention.

Referring to FIG. 4, a semiconductor layer 50 and a gate dielectric 60 are formed on a resultant structure where the first undercut regions UC1 are formed. The semiconductor layer 50 conformally covers inner walls of the first undercut regions UC1, but do not completely fill the first undercut regions UC1. To this end, as illustrated in FIG. 9, a total thickness t2 of the semiconductor layer 50 and the gate dielectric 60 may be thinner than half the distance (d) between the second mold patterns (e.g., 142 and 143) adjacent to each other vertically.

The semiconductor layer 50 may include a silicon layer formed through chemical vapor deposition (CVD). The semiconductor layer 50 may be formed to conformally cover the exposed surface of the mold structure 100. As a result, the semiconductor layer 50 may include horizontal portions HP covering the top and bottom surfaces of the second mold patterns 141 to 144 exposed by the first undercut regions UC1, and vertical portions VP covering sidewalls of the first mold patterns 131 to 134 defining the first undercut regions UC1. The vertical portion VP may connect two horizontal portions HP adjacent to each other vertically at sidewalls of the second mold patterns 141 to 144.

In addition, the gate dielectric 60 may be used as a data storage layer. For example, the gate dielectric 60 may include a charge storage layer. To be specific, the gate dielectric 60 may include a tunnel insulation layer 60a, a charge storage layer 60b, and a blocking insulation layer 60c, which are stacked in sequence, as illustrated in FIG. 9. The blocking insulation layer 60c may include at least one of a silicon oxide layer, a silicon nitride layer, a silicon oxynitride layer, and high-dielectric-constant layers, and may have a multilayered structure. Here, the high-dielectric-constant layer means insulation materials having high dielectric constants higher than the silicon oxide layer. For example, the high-dielectric-constant layer may include a tantalum oxide layer, a titanium oxide layer, a hafnium oxide layer, a zirconium oxide layer, an aluminum oxide layer, a yttrium oxide layer, a niobium oxide layer, a cesium oxide layer, an indium oxide layer, an iridium oxide layer, a barium strontium titanate (BST) layer, a lead zirconate titanate (PZT) layer. The tunnel insulation layer 60a may be formed of a material having a dielectric constant lower than the blocking insulation layer 60c. The charge storage layer 60b may include an insulation thin film (e.g., a silicon nitride layer) having charge trap sites sufficiently, or an insulation thin film having conductive particles. According to the embodiment, the tunnel insulation layer is a silicon oxide layer, and the charge storage layer 60b is a silicon nitride layer. The blocking insulation layer may be an insulation layer including an aluminum oxide layer.

Figure 5:
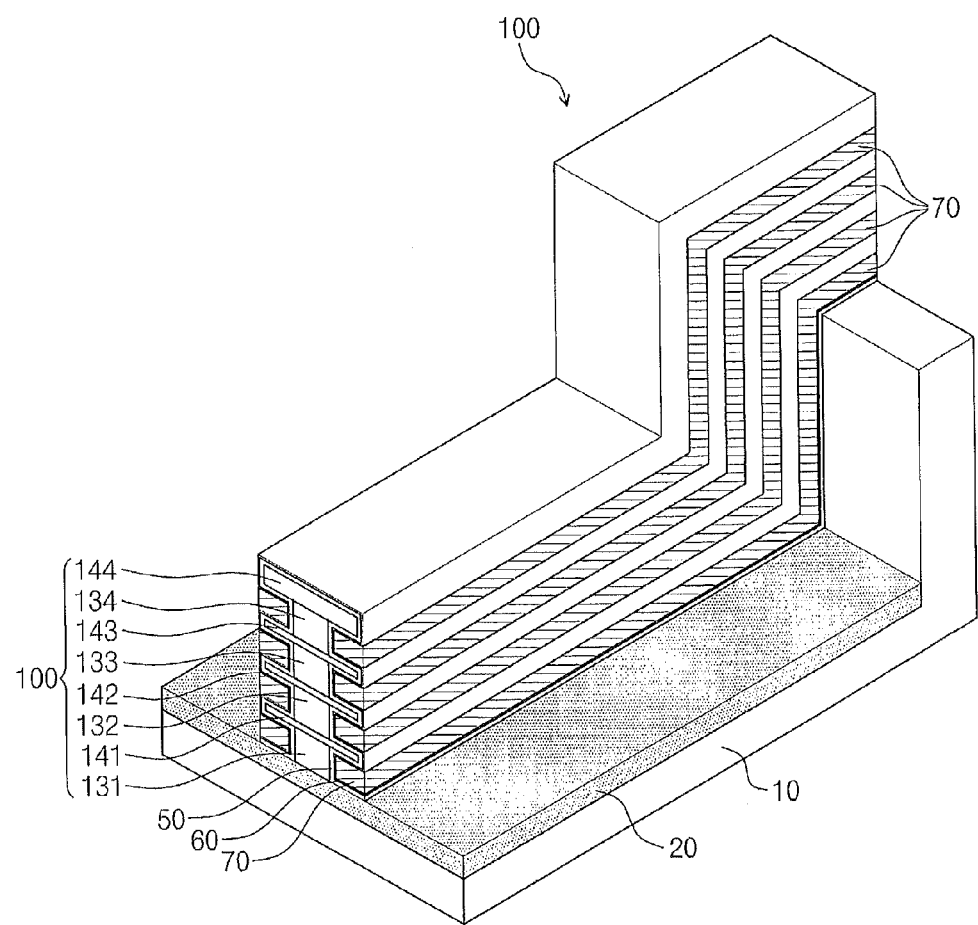

Referring to FIG. 5, a gate electrode layer (not shown) is formed to fill the first under regions UC1 where the gate dielectric 60 is formed. At this time, the gate electrode layer may be formed in such a manner that it fills the first openings O1 as well as the first undercut regions UC1. The gate electrode layer may be formed of at least one of metallic material, metal silicide, metal nitride, and silicon using one of chemical vapor deposition (CVD), physical vapor deposition (PVD), metalorganic CVD (MOCVD), and electroplating.

Subsequently, the gate electrode layer is patterned to form gate lines 70 that are locally disposed in the first undercut regions UC1. The forming of the gate lines 70 may include etching the gate electrode layer using at least one of an isotropic etching process and an anisotropic etching process. For instance, the forming of the gate lines 70 may include isotropically etching the gate electrode layer to expose the sidewall of the uppermost second mold pattern 144, and then forming spacers on the exposed sidewall. Thereafter, the gate electrode layer is anisotropically etched using the spacers as an etch mask to form a trench. The gate electrode layer under the spacer is then, etched isotropically until the gate dielectric 60 is exposed, thereby forming the gate lines 70 that are locally disposed in the first undercut regions UC1.

According to the embodiment, the gate dielectric 60 formed on the sidewalls of the second mold patterns 141 to 144 are etched to form gate dielectric patterns exposing the semiconductor layer 50. The gate dielectric patterns are vertically disconnected so that they may be locally formed within the first undercut regions UC1 and electrically isolated from one another.

Figure 6:
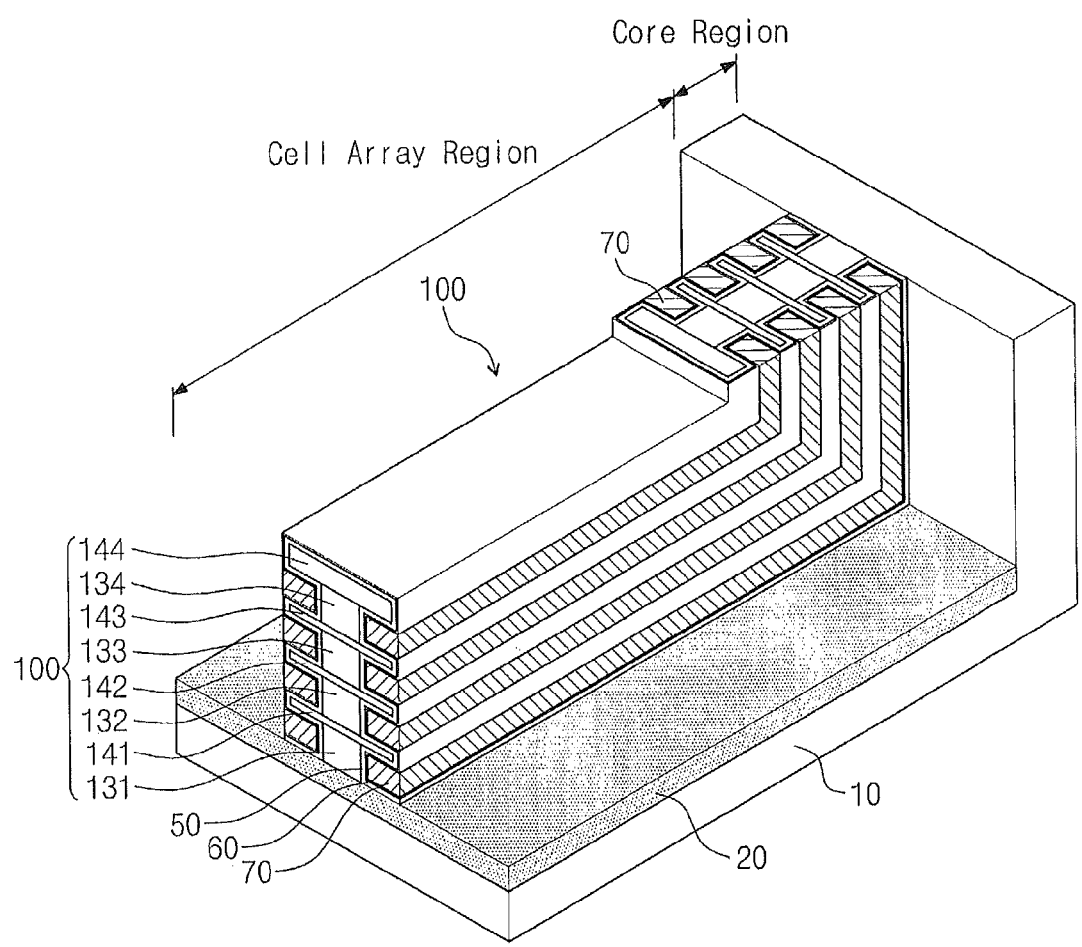

Referring to FIG. 6, the resultant structure where the gate lines 70 are formed are planarized to expose the top surface of the substrate 10. As described above, the total thickness t1 of the first mold layers 31 to 34 and the second mold layers 41 to 44 may be smaller than the step height H between the cell array region and the core region. In this embodiment, the mold structures 100 and the gate lines 70 are restrictively disposed inside the cell array region through planarization.

Meanwhile, each of the gate lines 70 defined in the cell array region may includes an interconnection region parallel with the top surface of the substrate 10, and a contact region extending from one end or both ends of the interconnection region. The contact regions of the gate lines 70 are disposed in the vicinity of a boundary between the cell array region and the core region, and, as a result of the planarization etching process, their top surfaces may be equal in height to the exposed top surfaces of the substrate 10. According to the embodiment, prior to the planarization etching, a buried insulation layer (not shown) may be further formed to fill the first openings O1 while covering the resultant structure where the gate lines 70 are formed.

Figure 7:
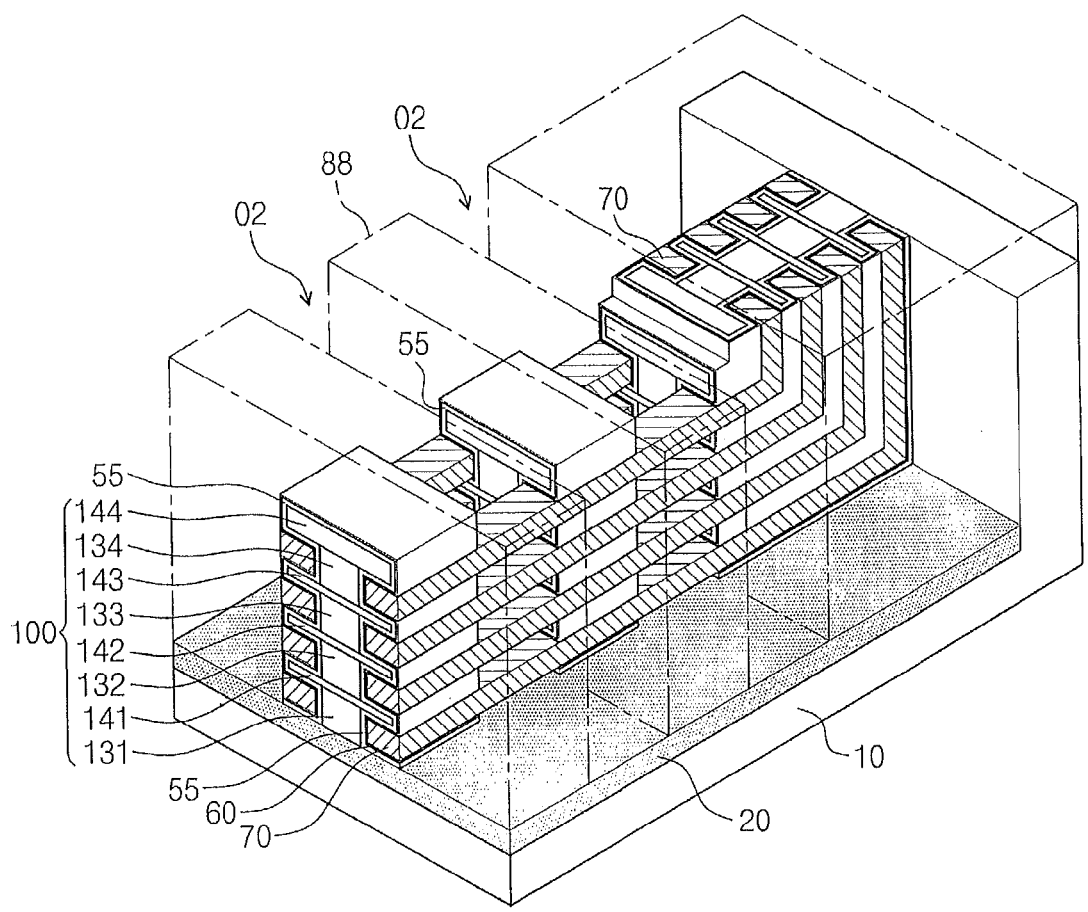

Referring to FIG. 7, the semiconductor layer 50 is patterned to form a plurality of semiconductor patterns which are separated from each other. The forming of the semiconductor patterns 55 may include patterning the buried insulation layer to form a buried insulation pattern 88 defining second openings O2 exposing the semiconductor layer 50, and then etching the exposed semiconductor layer 50. At this time, the second openings O2 may be formed in a direction crossing the mold structures 100. Consequently, the semiconductor patterns 55 may be locally formed in a region where the buried insulation pattern 88 and the mold structures 100 cross each other.

The etching of the buried insulation layer may be performed using an etch recipe having an etch selectivity with respect to the semiconductor layer 50. The etching of the semiconductor layer 50 may be performed using an etch recipe having an etch selectivity with respect to the buried insulation layer and the gate lines 70. The etching of the semiconductor layer 50 may include etching the mold structure 100 and the gate dielectric 60.

Figure 8:
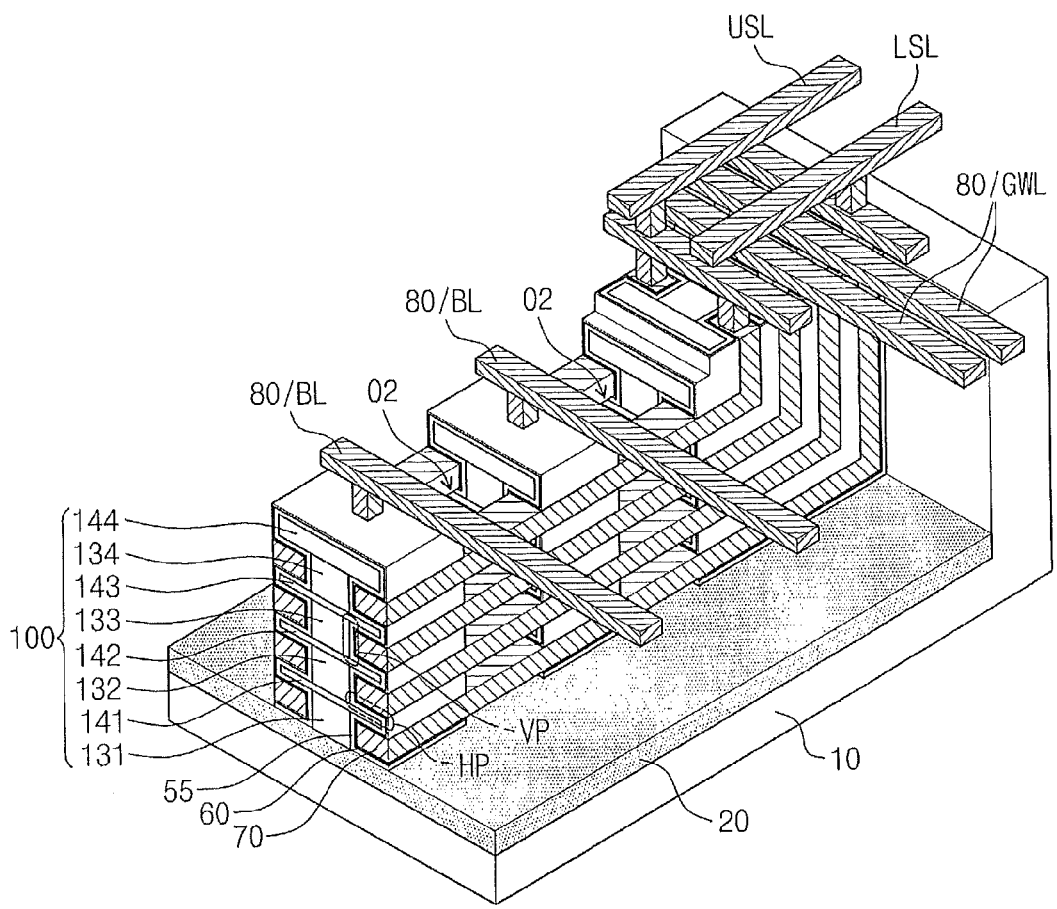

Referring to FIG. 8, an insulation layer (not shown) filling the second openings O2 is formed on the resultant structure where the semiconductor patterns 55 are formed. Thereafter, upper interconnections 80 are formed, which are in contact with the semiconductor patterns 55 and the gate lines 70. The upper interconnections 80, which contact the semiconductor patterns 55 and the gate lines 70 respectively, may be used as bit lines BL and global gate lines GWL.

According this embodiment, a pair of the gate lines 70 may be mirror-symmetrically arranged with respect to the first mold patterns 131 to 134 in the same layer of one mold structure 100. In this case, one global gate line GWL may be commonly connected to a pair of the gate lines 70 formed in the same layer on opposite sides of the respective mold structure.

In addition, after forming the upper interconnections 80, an upper selection line USL and a lower selection line LSL may be formed to be connected to the uppermost gate line and the lowermost gate line of the gate line 70, respectively. The upper and lower selection lines USL and LSL may be formed in a direction crossing the bit line BL.

FIG. 9 is a cross-sectional view illustrating a portion of the semiconductor device according to the embodiment of the present invention.

Referring to FIG. 9, the gate dielectric 60 may include a tunnel insulation layer 60*a* adjacent to the semiconductor pattern 55, a blocking insulation layer 60*c* adjacent to the mold structure 100, and a charge storage layer 60*b* interposed between the tunnel insulation layer 60*a* and the blocking insulation layer 60*c*.

The blocking insulation layer 60*c* may include at least one of a silicon oxide layer, a silicon nitride layer, a silicon oxynitride layer, and high-dielectric-constant layers. According to one embodiment, the blocking insulation layer 60*c* may have a monolayered structure including the high-dielectric-constant layers. The tunnel insulation layer 60*a* may be formed of a material having a dielectric constant lower than the blocking insulation layer 60*c*. The charge storage layer 60*b* may include an insulation thin film (e.g., a silicon nitride layer) having charge trap sites sufficiently, or an insulation thin film having conductive particles. According to the embodiment, the tunnel insulation layer 60*a* is a silicon oxide layer, and the charge storage layer 60*b* is a silicon nitride layer. The blocking insulation layer 60*c* may be an insulation layer including an aluminum oxide layer. In this case, the second mold patterns 141 to 144 may include a tantalum nitride layer.

FIGS. 10 through 14 are perspective views illustrating a method of fabricating a semiconductor device according to another embodiment of the present invention. The method of fabricating the semiconductor device according to this embodiment may include fabrication processes that have been described with reference to FIGS. 1 through 4.

Figure 10:
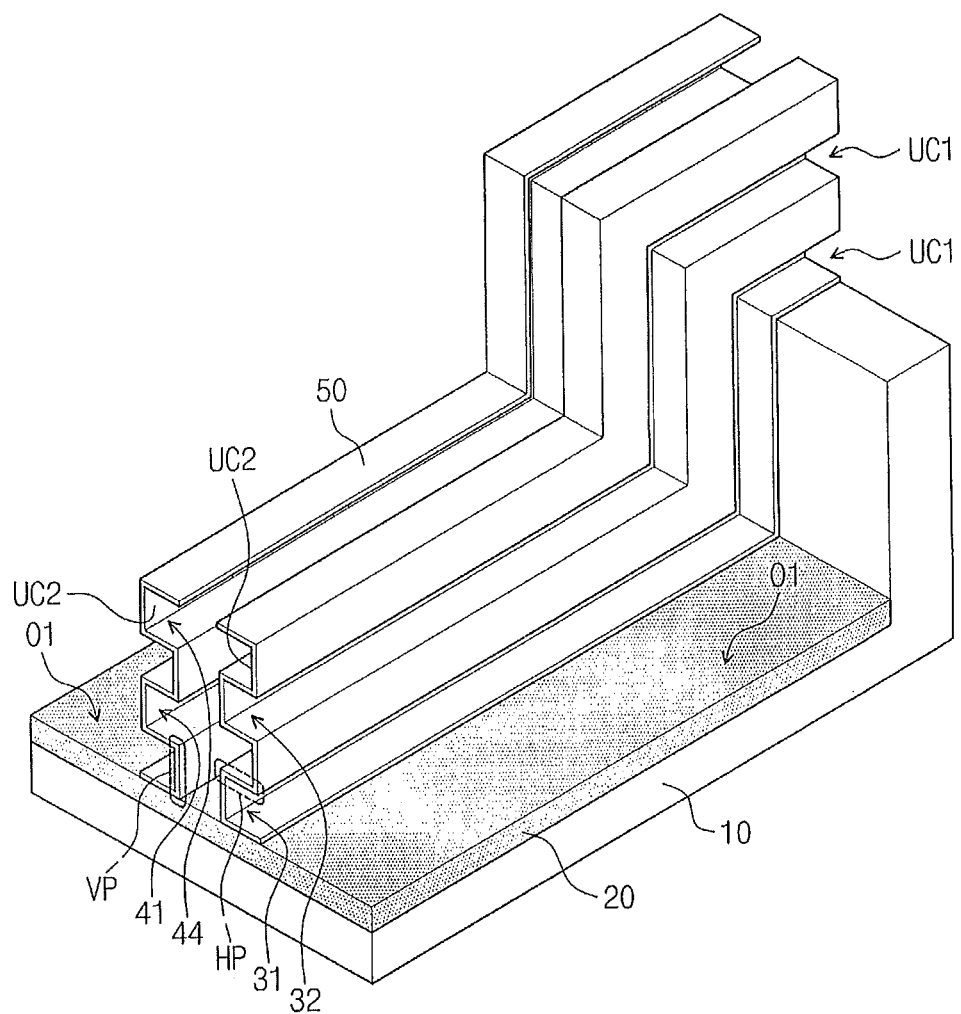
FIGS. 10 through 14 are perspective views illustrating a method of fabricating a semiconductor device according to another embodiment of the present invention.

Referring to FIGS. 4 and 10, after the formation of the semiconductor layer 50, the mold structure 100 is selectively removed to leave the semiconductor layer 50 on the substrate 10. Removing of the mold structure 100 may include patterning the semiconductor layer 50 so as to expose the central portion of the top surface of the mold structure 100. Subsequently, the exposed mold structure 100 is removed using at least one of isotropic and anisotropic etching technologies. Removing of the mold structure 100 may be performed using an etch recipe using an etch selectivity with respect to the semiconductor layer 50. According to an embodiment, to prevent the transformation of the remaining semiconductor layer 50, removing of the mold structure 100 may be performed through etching and cleaning techniques using supercritical carbon dioxide.

Figure 15:
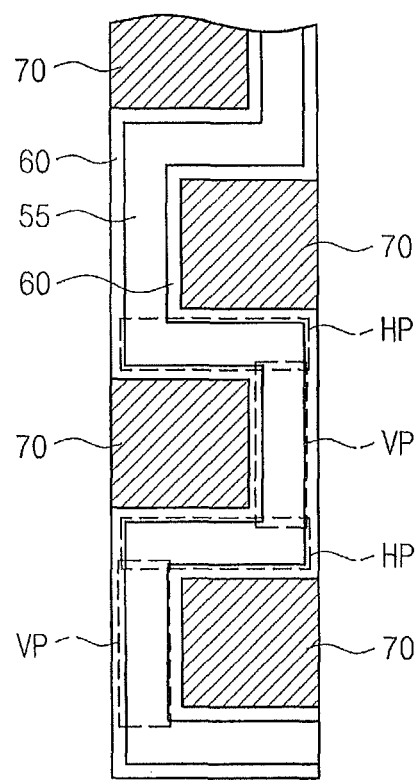
FIG. 15 is illustrating a portion of the semiconductor device according to another embodiment of the present invention.

When the mold structure 100 is removed, second undercut regions UC2 may be formed between the first undercut regions UC1 adjacent to each other vertically. That is, the first and second undercut regions UC1 and UC2 are sequentially and alternatingly arranged, and their shapes are defined by the remaining semiconductor layer 50. According to the embodiment, as illustrated in FIG. 15, the semiconductor layer 50 includes horizontal portions HP separating the first and second undercut regions UC1 and UC2, and vertical portions VP defining one sidewall of each of the first and second undercut regions UC1 and UC2. As illustrated in the figures, the first undercut regions UC1 have inlets adjacent to the first openings O1 (i.e., a region where the vertical portion is not formed), and the second undercut regions UC2 have inlets adjacent to a region where the mold structure 100 is removed.

According to an embodiment, the first and second undercut regions UC1 and UC2 may be formed to be substantially equal in height to each other. To this end, the first mold layers 31 to 34 and the second mold layers 41 to 44 may be formed to have the same thickness substantially, which differs from the embodiment of FIG. 1. Alternatively, the first mold layers 31 to 34 may be formed thicker than the second mold layers 41 to 44 in consideration of the thickness of the semiconductor layer 50.

Figure 11:
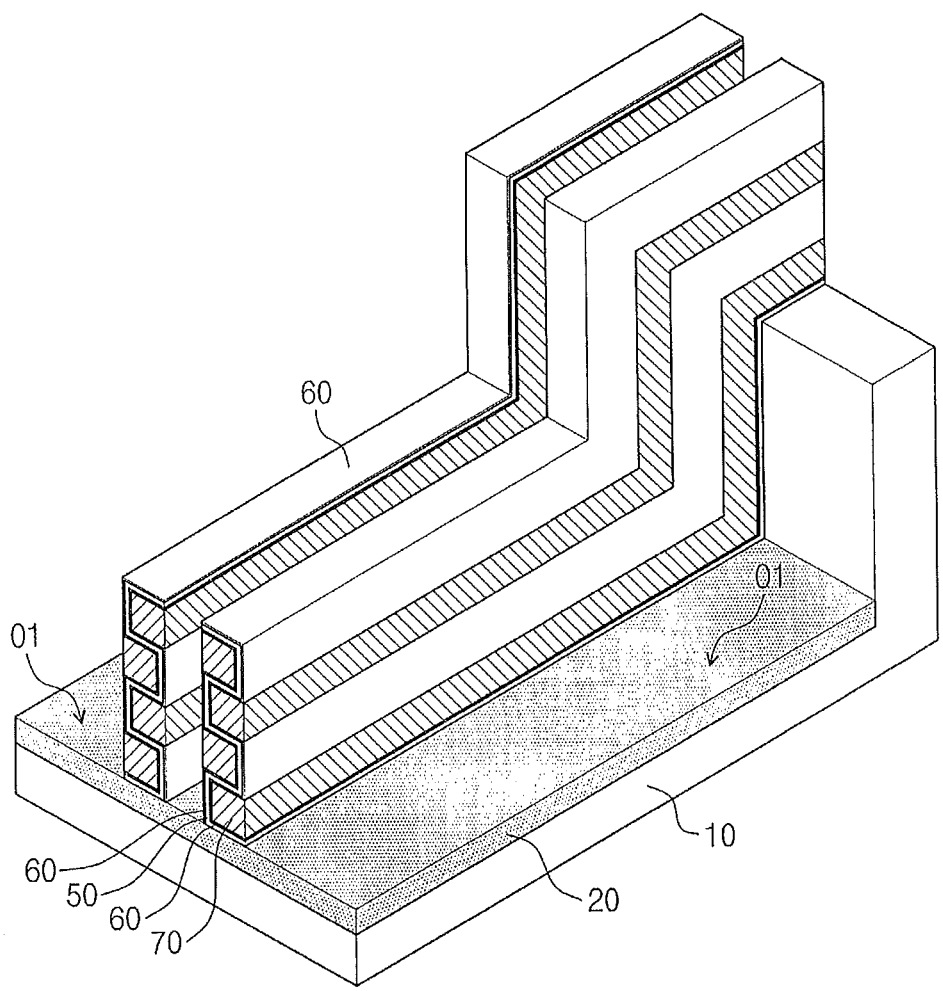

Referring to FIG. 11, a gate dielectric 60 and gate lines 70 are formed. Here, the gate dielectric 60 covers the semiconductor layer 50, and the gate lines 70 fill the first and second undercut regions UC1 and UC2 where the gate dielectric 60 is formed. The gate dielectric 60 may be formed to conformally cover inner walls of the first and second undercut regions UC1 and UC2. The gate lines 70 are locally disposed in the first and second undercut regions UC1 and UC2, and are electrically isolated from each other.

This embodiment differs from the previous embodiment of FIGS. 1 through 8 in that the gate dielectric 60 is formed to cover the inner walls of the second undercut regions UC2 and the gate lines 70 are also formed in the second undercut region UC2. However, the gate dielectric 60 and the gate lines 70 may be formed through the same method of the embodiment described with reference FIGS. 1 through 8, or modified embodiments of FIGS. 1 through 8.

Figure 12:
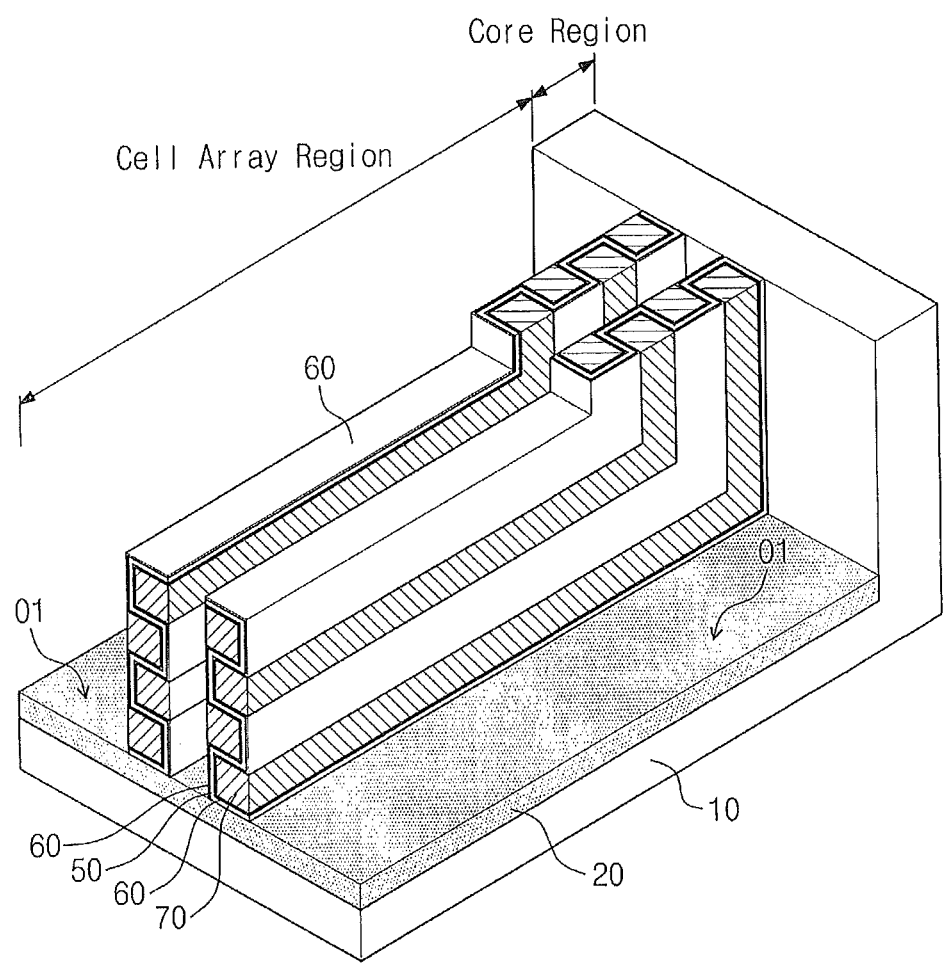
Figure 13:
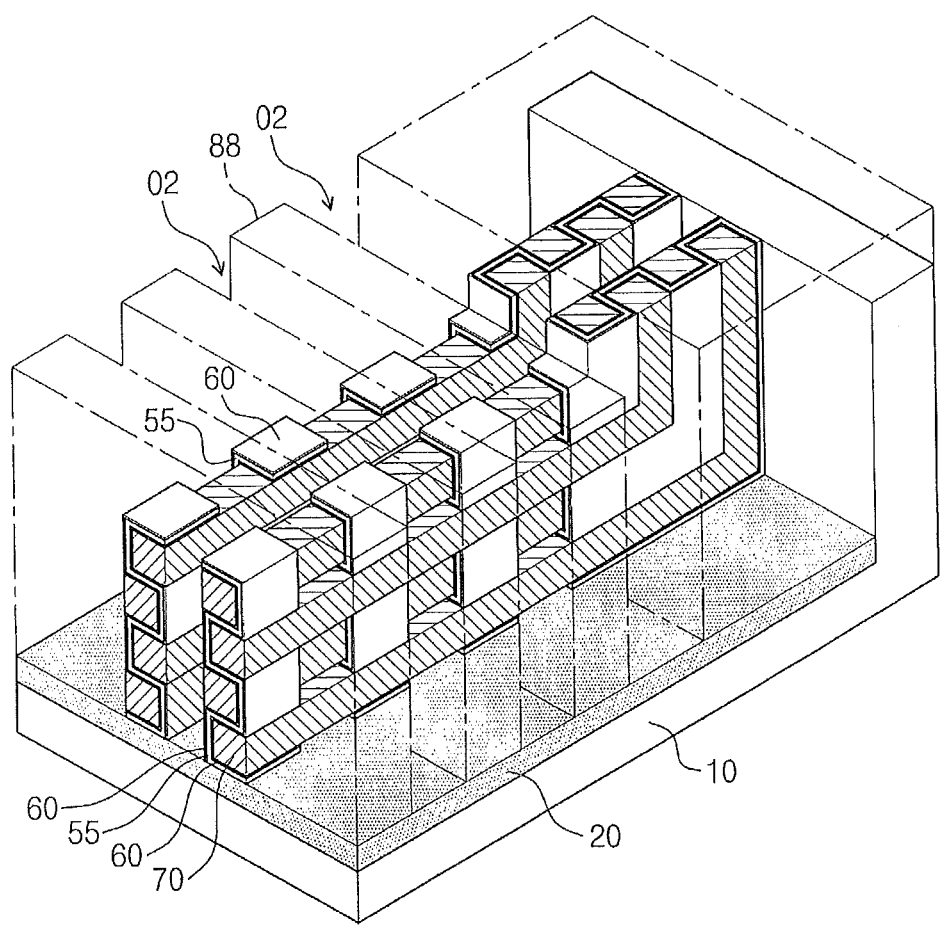
Figure 14:
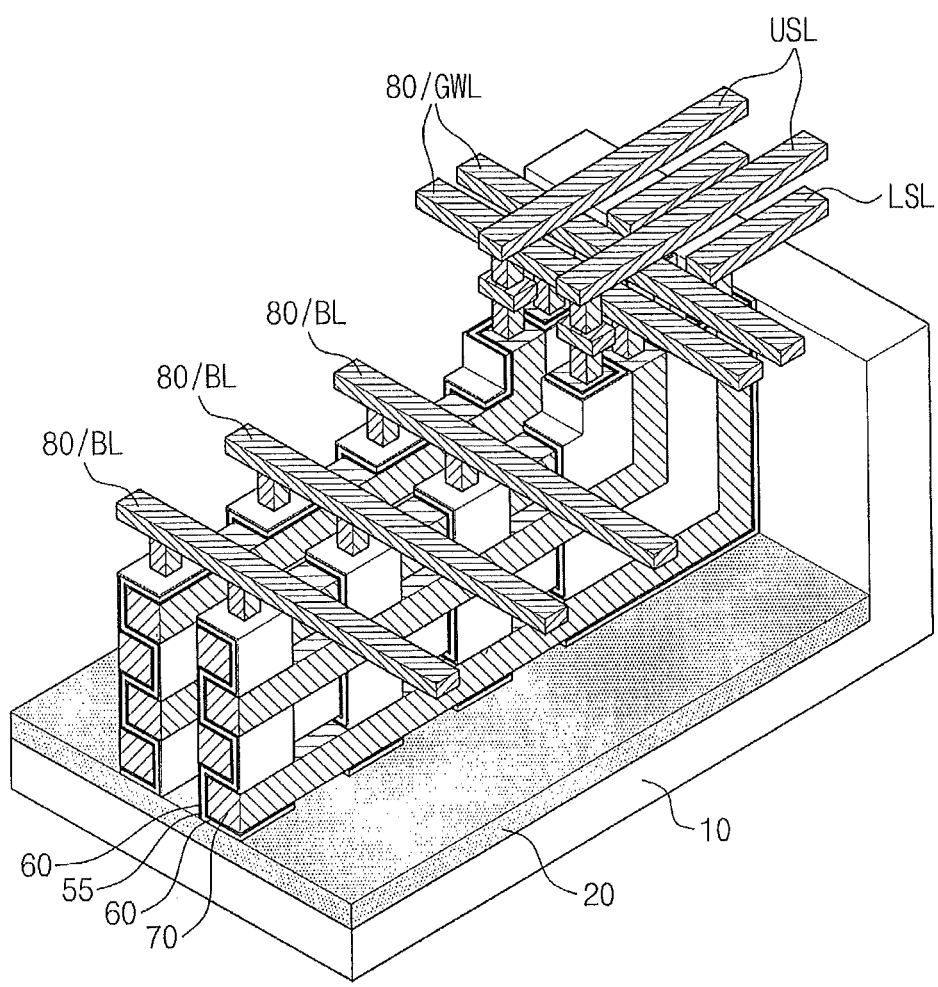

Referring to FIGS. 12 through 14, the resultant structure where the gate lines 70 are formed is planarized to expose the top surface of the substrate 10 in the core region. As a result, the gate lines 70 are restrictively formed inside the cell array region. Thereafter, the semiconductor layer 50 is patterned to form a plurality of semiconductor patterns 55, and then upper interconnection 80 contacting the semiconductor patterns 55 and the gate lines 70 are formed. In addition, after forming the upper interconnections 80, an upper selection line USL and a lower selection line LSL may be formed to contact the uppermost gate line and the lowermost gate line of the gate line, respectively.

According to this embodiment, a pair of the semiconductor patterns 55, which are adjacent to each other horizontally, can be formed using the same mold structure, however, they can be electrically isolated from each other during the removal of the mold structure 100, as described already with reference to FIG. 10. The electrical connection between the isolated semiconductor patterns 55 and the bit lines (BL) 80 can be independently controlled by the upper and lower selection lines USL and LSL formed in a direction crossing the bit lines (BL) 80. Therefore, the semiconductor device according to this embodiment can have higher integration degree.

The planarization etching, the forming of the semiconductor patterns 55, and the forming of the upper interconnection 80 may be performed using the methods that have been described with reference to FIGS. 6 through 8.

Referring to FIGS. 8 and 14 again, semiconductor devices according to embodiments of the present invention will be described. For convenience in description, the aforesaid technical features may be omitted below.

As illustrated in FIGS. 8, 9, 14 and 15, the semiconductor device according to the present invention may include horizontal portions HP parallel with the top surface of the substrate 10, and vertical portions VP connecting the horizontal portions HP. At this time, to connect the horizontal portions HP to the vertical portions VP in series, the vertical portions VP may be connected to edges of the horizontal portions HP which face each other. Consequently, the semiconductor patterns 55 may have a zigzag-shaped cross-sections.

According to the embodiment, as illustrated in FIG. 9, one vertical portion VP, and a pair of horizontal portions HP respectively connected to the top and bottom of the vertical portion VP are disposed between the two gates 70 adjacent to each other vertically. In this case, the second mold patterns 141 to 144 are disposed between the pair of the horizontal portions HP to vertically separate the gate lines 70. In addition, the first mold patterns 131 to 134 have widths narrower than the second mold patterns 141 to 144 to thereby horizontally separate the two horizontally adjacent gate lines 70.

According to another embodiment, as illustrated in FIG. 15, one horizontal portion HP may be disposed between the vertically adjacent two gate lines 70. In this case, one vertical portion and its underlying or overlying horizontal portions HP are disposed on opposite sidewalls of the gate line 70. That is, the horizontal portions HP are alternatingly disposed on two opposite sidewalls of the gate line 70. According to this embodiment, the gate lines, which are stacked in sequence, form one gate structure. The semiconductor patterns 55 facing two adjacent gate structures are electrically isolated from each other. At this time, the electrical connection between each semiconductor pattern 55 and the bit line (BL) 80 can be controlled by different upper and lower selection lines USL and LSL, as described above.

Figure 16:
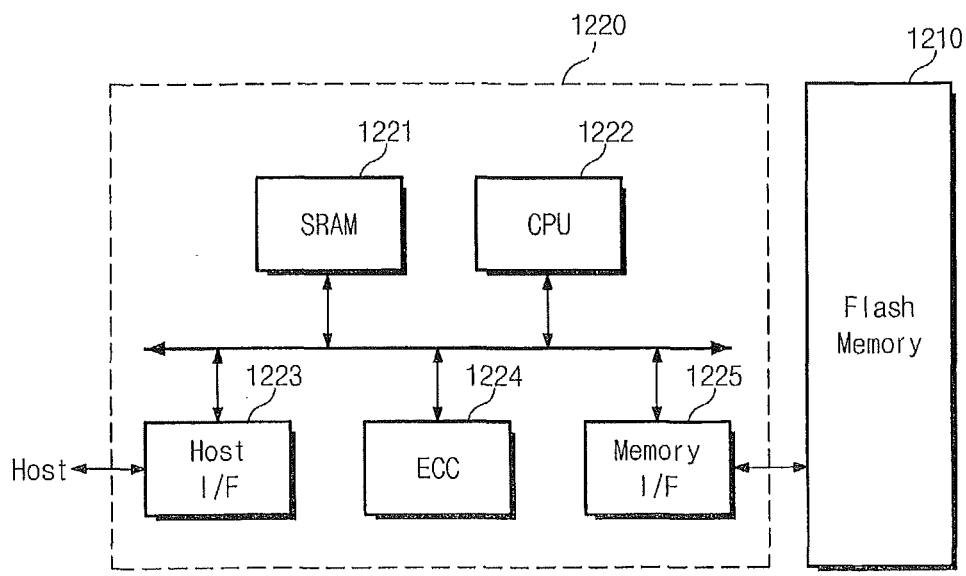
FIG. 16 is a block diagram illustrating one example of a memory card including a flash memory device according to the present invention.

FIG. 16 is a block diagram illustrating one example of a memory card 1200 including a flash memory device according to the present invention. Referring to FIG. 16, the memory card 1200 that supporting high data storage capacity includes a flash memory device 1210 according to the present invention. The memory card 1200 according to the present invention includes a memory controller 1220 that controls the whole data exchange between a host and the flash memory device 1210.

An SRAN 1221 is used as an operation memory of a processing unit 1222. A host interface 1223 includes a data exchange protocol of the host connected to the memory card 1200. An error correction block 1224 detects and corrects an error in data read from the multi-bit flash memory device 1210. A memory interface 1225 interfaces with the flash memory device 1210 of the present invention. The processing unit 1222 performs the whole control operation to exchange data of the memory controller 1220. Although not shown, it is obvious to those skilled in the art that the memory card 1200 according to the present invention may further include a ROM (not shown) storing code data for interfacing with the host.

According to the flash memory device and the memory card or the memory system of the present invention, it is possible to provide a memory system with high reliability through the flash memory device 1210 with improved erasing characteristics of dummy cells. In particular, the flash memory device of the present invention can be provided in a memory system such as a solid-state disk (SSD) that is actively advanced recently. In this case, it is possible to realize a memory system with high reliability by preventing read errors caused by the dummy cells.

Figure 17:
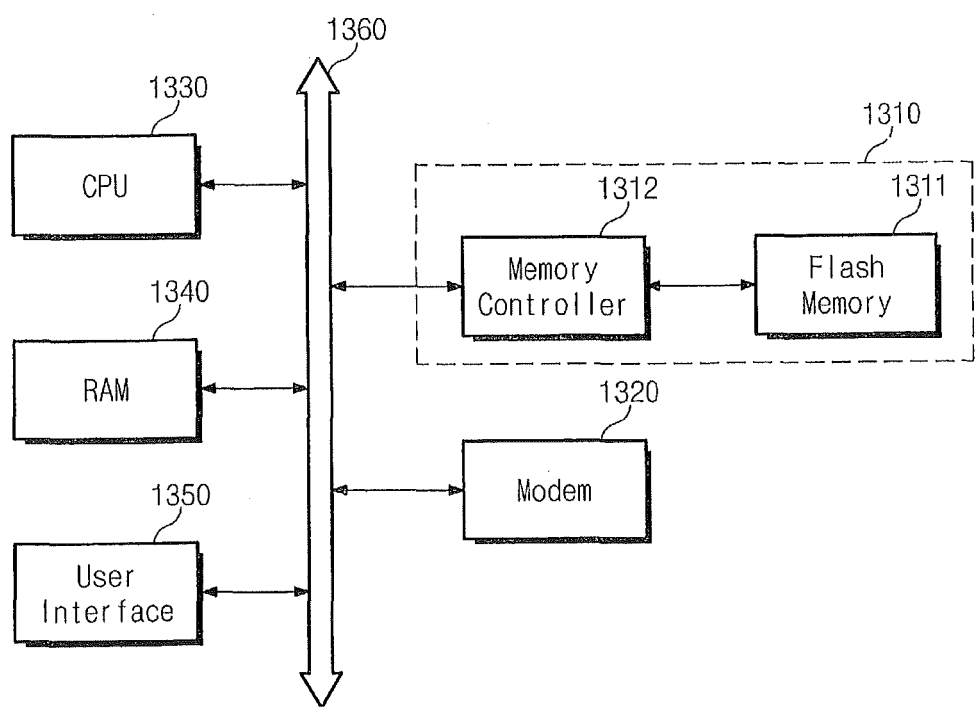
FIG. 17 is a block diagram of an information processing system with a flash memory system mounted according to the present invention.

FIG. 17 is a block diagram of a data processing system 1300 with a flash memory system 1310 mounted according to the present invention. Referring to FIG. 17, the flash memory system 1310 of the present invention is mounted on the data processing system such as a mobile apparatus and a desktop computer. The data processing system 1300 according to the present invention includes the flash memory system 1310, a modem 1320 electrically connected to a system bus 1360, a central processing unit (CPU) 1330, a RAM 1340, a user interface 1350. The flash memory system 1310 may have the same configuration as the aforesaid memory system or flash memory system substantially. Data processed by the CPU 1330 or data input from the outside are stored in the flash memory system 1310. Herein, the flash memory system 1310 may be implemented into a solid-state disk (SSD). In this case, the data processing system 1300 can store large data in the flash memory system 1310. According to an increase in reliability, the flash memory system 1310 can reduce resources required for error correction to thereby provide high-speed data exchange function to the data processing system 1300. Although not shown, it is obvious to those skilled in the art that the data processing system 1300 according to the present invention may further include an application chipset, a camera image processor (CIS), an input/output unit.

Further, the flash memory device or the memory system according to the present invention can be packaged in various forms. For example, the flash memory device or the memory system according to the present invention may be packaged and mounted in such a manner as package on package (PoP), ball grid arrays (BGAs), chip scale packages (CSPs), plastic leaded chip carrier (PLCC), plastic dual in-line package (PDIP), die in waffle pack, die in waver form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

According to the present invention, there is provided a semiconductor device including a zigzag-shaped semiconductor pattern. The semiconductor pattern serves as a channel connecting a bit line (or upper interconnection) and a source line (or lower interconnection) in series, and may have horizontal portions disposed between stacked gate lines, and vertical portions connecting the horizontal portions in series. The electrical connection between the bit line and the source line can be controlled by voltages applied to the gate lines. The respective semiconductor patterns may be independently selected by an upper selection line and the bit line. Accordingly, the semiconductor pattern may be used as a channel of a NAND string structure. As a result, a NAND flash memory device according to the present invention can have an increased degree of integration.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
   a lower interconnection on a substrate;
   at least one upper interconnection disposed on the lower interconnection;
   at least one gate structure disposed between the upper interconnection and the lower interconnection, the gate structure comprising a plurality of gate lines vertically stacked and each of the gate lines having a wiring portion substantially parallel to an upper surface of the substrate and a contact portion extending from the wiring portion along a direction penetrating the upper surface of the substrate;
   at least one semiconductor pattern connecting the upper and lower interconnections; and
   a mold insulation layer on the substrate, a sidewall of the mold insulation layer having a plurality of undercut regions vertically spaced apart from each other, wherein each of the plurality of gate lines is in respective ones of the plurality of undercut regions, and the semiconductor pattern conformally covers the sidewall of the mold insulation layer.

2. The semiconductor device of claim 1, wherein the contact portions of the gate lines have top surfaces that are disposed at substantially the same level from the upper surface of the substrate.

3. The semiconductor device of claim 1, wherein a length of the wiring portion is reduced, as the wiring portion is more distant from the substrate.

4. The semiconductor device of claim 1,
wherein a top surface of a portion of the gate structure including the wiring portions is lower than a top surface of a portion of the gate structure including the contact portions relative to the upper surface of the substrate.

5. The semiconductor device of claim 1, further comprising interconnection lines connected to the contact portions of the gate lines, respectively.

6. The semiconductor device of claim 1, further comprising an upper selection line connected to an uppermost gate line and a lower selection line connected to a lowermost gate line.

7. The semiconductor device of claim 1, further comprising a data storage layer disposed between the semiconductor pattern and the gate lines.

8. The semiconductor device of claim 1, wherein the semiconductor pattern covers an upper surface and a lower surface of each of the gate lines.

9. The semiconductor device of claim 1, wherein the mold insulation layer comprises first mold patterns and second mold patterns alternately stacked, and the second mold pattern is wider than the first mold pattern, and is disposed between the first mold patterns.

10. A semiconductor device comprising:
a lower interconnection on a substrate;
an upper interconnection on the lower interconnection;
a gate structure between the upper interconnection and the lower interconnection, the gate structure comprising a plurality of gate lines vertically stacked and each of the plurality of gate lines including a wiring portion substantially parallel to an upper surface of the substrate and a contact portion extending from the wiring portion along a direction substantially perpendicular to the upper surface of the substrate; and
a semiconductor pattern connecting the upper interconnection and the lower interconnection, the semiconductor pattern covering an upper surface of the each of the plurality of gate lines and extending from a first sidewall to a second sidewall of the each of the plurality of gate lines.

11. The semiconductor device of claim 10, wherein the semiconductor pattern comprises a channel layer.

12. The semiconductor device of claim 11, further comprising a charge storage layer between the semiconductor pattern and the plurality of gate lines, wherein the charge storage layer covers the upper surface of the each of the plurality of gate lines and extends from the first sidewall to the second sidewall of the each of the plurality of gate lines.

13. The semiconductor device of claim 10, wherein the semiconductor pattern covers an upper surface of the gate structure and extends from a first sidewall to a second sidewall of the gate structure, and wherein the upper interconnection contacts the semiconductor pattern covering the upper surface of the gate structure.

14. A semiconductor device comprising:
a lower interconnection on a substrate;
an upper interconnection on the lower interconnection;
a gate structure between the upper interconnection and the lower interconnection, the gate structure comprising a plurality of gate lines vertically stacked and each of the plurality of gate lines including a wiring portion substantially parallel to an upper surface of the substrate and a contact portion extending from the wiring portion along a direction substantially perpendicular to the upper surface of the substrate; and
a semiconductor pattern connecting the upper interconnection and the lower interconnection, wherein the semiconductor pattern follows a winding path through the plurality of gate lines.

15. The semiconductor device of claim 14, wherein the plurality of gate lines comprise a plurality of first gate lines alternating with a plurality of second gate lines, and wherein the semiconductor pattern covers sidewalls of the plurality of first gate lines in a first side of the plurality of gate lines and sidewalls of the plurality of second gate lines in a second side of the plurality of gate lines, which is opposite the first side of the plurality of gate lines.

16. The semiconductor device of claim 14, wherein the semiconductor pattern comprises a channel layer.

17. The semiconductor device of claim 14, wherein the semiconductor pattern covers an upper surface of the gate structure and extends from a first sidewall to a second sidewall of the gate structure, and wherein the upper interconnection contacts the semiconductor pattern covering the upper surface of the gate structure.

* * * * *